United States Patent
Yamazaki

(10) Patent No.: US 7,034,381 B2
(45) Date of Patent: *Apr. 25, 2006

(54) SEMICONDUCTOR DEVICE

(75) Inventor: Shunpei Yamazaki, Tokyo (JP)

(73) Assignee: Semiconductor Energey Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/927,092

(22) Filed: Aug. 27, 2004

(65) Prior Publication Data

US 2005/0023526 A1    Feb. 3, 2005

Related U.S. Application Data

(63) Continuation of application No. 10/192,991, filed on Jul. 10, 2002, now Pat. No. 6,787,887, which is a continuation of application No. 09/362,810, filed on Jul. 28, 1999, now Pat. No. 6,445,059, which is a continuation of application No. 08/767,179, filed on Dec. 16, 1996, now Pat. No. 5,990,542.

(30) Foreign Application Priority Data

Dec. 14, 1995  (JP)  ................................. 7-347754

(51) Int. Cl.
*H01L 23/58*  (2006.01)

(52) U.S. Cl. .......................... 257/642; 257/72
(58) Field of Classification Search ................ 257/642, 257/643, 639, 640, 66, 72, 347
See application file for complete search history.

(56) References Cited

U.S. PATENT DOCUMENTS

| | | | |
|---|---|---|---|
| 3,844,908 A | 10/1974 | Matsuo et al. |
| 4,103,297 A | 7/1978 | McGreivy et al. |
| 4,226,898 A | 10/1980 | Ovshinsky et al. |
| 4,239,346 A | 12/1980 | Lloyd |
| 4,523,370 A | 6/1985 | Sullivan et al. |
| 4,557,036 A | 12/1985 | Kyuragi et al. |
| 4,597,637 A | 7/1986 | Ohta |
| 4,618,878 A | 10/1986 | Aoyama et al. |
| 4,680,580 A | 7/1987 | Kawahara |
| 4,759,610 A | 7/1988 | Yanagisawa |
| 4,800,174 A | 1/1989 | Ishihara et al. |
| 4,818,077 A | 4/1989 | Ohwada et al. |

(Continued)

FOREIGN PATENT DOCUMENTS

CN    1090062    7/1994

(Continued)

OTHER PUBLICATIONS

Kim, et al.; 4.4: Planarized Black Matrix on TFT Structure for TFT-LCD Monitors; 1997; Kiheung, Korea; SID 97 Digest, pp. 19-22, Dec. 1997.

(Continued)

*Primary Examiner*—Mark V. Prenty
(74) *Attorney, Agent, or Firm*—Fish & Richardson P.C.

(57) ABSTRACT

A resin material having low dielectric constant is used as an inter-layer insulating film and its bottom surface is contacted with a silicon oxide film across the whole surface thereof. Thereby, the surface may be flattened and capacity produced between a thin film transistor and an pixel electrode may be reduced. Further, it allows to avoid a problem that impurity ions and moisture infiltrate into the lower surface of the resin material, thus degrading the reliability of whole semiconductor device.

13 Claims, 6 Drawing Sheets

U.S. PATENT DOCUMENTS

| | | | |
|---|---|---|---|
| 4,853,760 A | 8/1989 | Abe et al. | |
| 4,864,376 A | 9/1989 | Aoki et al. | |
| 4,938,565 A | 7/1990 | Ichikawa | |
| 4,949,141 A | 8/1990 | Busta | |
| 5,003,356 A | 3/1991 | Wakai et al. | |
| 5,012,228 A | 4/1991 | Masuda et al. | |
| 5,051,570 A | 9/1991 | Tsujikawa et al. | |
| 5,055,899 A | 10/1991 | Wakai | |
| 5,056,895 A | 10/1991 | Kahn | |
| 5,066,110 A | 11/1991 | Mizushima et al. | |
| 5,084,905 A | 1/1992 | Sasaki et al. | |
| 5,091,334 A | 2/1992 | Yamazaki et al. | |
| 5,117,278 A | 5/1992 | Bellersen et al. | |
| 5,132,821 A | 7/1992 | Nicholas | |
| 5,200,846 A | 4/1993 | Hiroki et al. | |
| 5,206,183 A | 4/1993 | Dennison | |
| 5,227,900 A | 7/1993 | Inaba et al. | |
| 5,233,211 A | 8/1993 | Hayashi et al. | |
| 5,235,195 A | 8/1993 | Tran et al. | |
| 5,286,659 A | 2/1994 | Mitani et al. | |
| 5,287,205 A | 2/1994 | Yamazaki et al. | |
| 5,289,016 A | 2/1994 | Noguchi | |
| 5,306,651 A | 4/1994 | Masumo et al. | |
| 5,327,001 A | 7/1994 | Wakai et al. | |
| 5,371,398 A | 12/1994 | Nishihara | |
| 5,453,858 A | 9/1995 | Yamazaki | |
| 5,474,941 A | 12/1995 | Mitani et al. | |
| 5,488,000 A | 1/1996 | Zhang et al. | |
| 5,495,353 A | 2/1996 | Yamazaki | |
| 5,499,123 A | 3/1996 | Mikoshiba | |
| 5,500,538 A | 3/1996 | Yamazaki et al. | |
| 5,514,879 A | 5/1996 | Yamazaki | |
| 5,568,288 A | 10/1996 | Yamazaki et al. | |
| 5,583,369 A | 12/1996 | Yamazaki et al. | |
| 5,585,951 A | 12/1996 | Noda et al. | |
| 5,604,380 A | 2/1997 | Nishimura et al. | |
| 5,612,799 A | 3/1997 | Yamazaki | |
| 5,614,732 A | 3/1997 | Yamazaki | |
| 5,641,974 A | 6/1997 | Den Boer et al. | |
| 5,654,203 A | 8/1997 | Ohtani et al. | |
| 5,684,365 A | 11/1997 | Tang et al. | |
| 5,686,328 A | 11/1997 | Zhang et al. | |
| 5,701,167 A | 12/1997 | Yamazaki | |
| 5,705,829 A | 1/1998 | Miyanaga et al. | |
| 5,731,628 A | 3/1998 | Terashima | |
| 5,763,899 A | 6/1998 | Yamazaki et al. | |
| 5,818,550 A | 10/1998 | Kadota et al. | |
| 5,821,138 A | 10/1998 | Yamazaki et al. | |
| 5,837,619 A | 11/1998 | Adachi et al. | |
| 5,844,254 A | 12/1998 | Manning et al. | |
| 5,849,043 A | 12/1998 | Zhang et al. | |
| 5,849,601 A | 12/1998 | Yamazaki | |
| 5,859,445 A | 1/1999 | Yamazaki | |
| 5,899,547 A | 5/1999 | Yamazaki et al. | |
| 5,905,555 A | 5/1999 | Yamazaki et al. | |
| 5,933,205 A | 8/1999 | Yamazaki et al. | |
| 5,946,059 A | 8/1999 | Yamazaki et al. | |
| 5,952,708 A | 9/1999 | Yamazaki | |
| 5,963,278 A | 10/1999 | Yamazaki et al. | |
| 5,990,542 A * | 11/1999 | Yamazaki | 257/642 |
| 6,011,277 A | 1/2000 | Yamazaki | |
| 6,023,075 A | 2/2000 | Yamazaki | |
| 6,169,293 B1 | 1/2001 | Yamazaki | |
| 6,239,470 B1 | 5/2001 | Yamazaki | |
| 6,252,249 B1 | 6/2001 | Yamazaki | |
| 6,281,520 B1 | 8/2001 | Yamazaki | |
| 6,441,468 B1 * | 8/2002 | Yamazaki | 257/642 |
| 6,445,059 B1 * | 9/2002 | Yamazaki | 257/642 |
| 6,501,097 B1 | 12/2002 | Zhang | |
| 6,787,887 B1 * | 9/2004 | Yamazaki | 257/642 |
| 2002/0117736 A1 | 8/2002 | Yamazaki et al. | |

FOREIGN PATENT DOCUMENTS

| | | |
|---|---|---|
| EP | 0 376 648 | 7/1990 |
| EP | 0603866 | 6/1994 |
| GB | 2 274 723 | 8/1994 |
| JP | 52-004496 | 2/1977 |
| JP | 52-005010 | 2/1977 |
| JP | 55-32026 | 3/1980 |
| JP | 57-020778 | 2/1982 |
| JP | 58-002871 | 1/1983 |
| JP | 59-72745 | 4/1984 |
| JP | 59-172627 | 9/1984 |
| JP | 61-141174 | 6/1986 |
| JP | 61-223721 | 10/1986 |
| JP | 01-124824 | 5/1989 |
| JP | 01-156725 | 6/1989 |
| JP | 01-183854 | 7/1989 |
| JP | 1-283839 | 11/1989 |
| JP | 02-144525 | 6/1990 |
| JP | 02-171721 | 7/1990 |
| JP | 21-79615 | 7/1990 |
| JP | 22-34134 | 9/1990 |
| JP | 22-63474 | 10/1990 |
| JP | 31-59250 | 7/1991 |
| JP | 04-086601 | 3/1992 |
| JP | 40-87341 | 3/1992 |
| JP | 04-125683 | 4/1992 |
| JP | 42-20626 | 8/1992 |
| JP | 42-26040 | 8/1992 |
| JP | 42-42724 | 8/1992 |
| JP | 42-69837 | 9/1992 |
| JP | 50-34723 | 2/1993 |
| JP | 53-15360 | 11/1993 |
| JP | 06-011728 | 1/1994 |
| JP | 09-067009 | 3/1994 |
| JP | 06-138484 | 5/1994 |
| JP | 06-148684 | 5/1994 |
| JP | 06-175156 | 6/1994 |
| JP | 06-186578 | 7/1994 |
| JP | 07-064110 | 3/1995 |
| JP | 70-99324 | 4/1995 |
| JP | 07-128688 | 5/1995 |
| JP | 71-40485 | 6/1995 |
| JP | 72-11635 | 8/1995 |
| JP | 08-068990 | 3/1996 |
| JP | 09-090425 | 4/1997 |
| JP | 63-284522 | 11/1998 |

OTHER PUBLICATIONS

H. Hayashi, et al., "Fabrication of Low-Temperature Bottom-Gate Poly-Si TFTs on Large-Area substrate by Linear-Beam Excimer Laser Crystallization and Ion Doping Method", IEEE International Electron Devices Meeting technical digest, pp. 829-832, 1995., Dec. 1995.

* cited by examiner

SEMICONDUCTOR DEVICE

CROSS-REFERENCE TO RELATED APPLICATIONS

This application is a continuation of U.S. application Ser. No. 10/192,991, filed Jul. 10, 2002, now U.S. Pat. No. 6,787,887, which is a continuation of U.S. application Ser. No. 09/362,810, filed Jul. 28, 1999, now U.S. Pat. No. 6,445,059, which is a continuation of U.S. application Ser. No. 08/767,179, filed Dec. 16, 1996, now U.S. Pat. No. 5,990,542, which claims the benefit of a foreign priority application filed in Japan as Serial No. 07-347754 on Dec. 14, 1995. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a structure of a semiconductor device which can be used for a flat panel display typified by an active matrix type liquid crystal display and an EL type display unit and more particularly to a structure of an inter-layer insulating film of a semiconductor device typified by a thin film transistor.

2. Description of Related Art

Hitherto, an active matrix type liquid crystal display has been known as a typical flat panel display. It has a structure in which a switching thin film transistor is provided in each of a large number of pixels disposed in a matrix and charge input/output to/from each pixel electrode is controlled by this thin film transistor.

In such a structure, it is necessary to coat the semiconductor device by an insulating film to prevent moisture, impurities and moving ions (e.g., sodium ions) which are great enemy of the semiconductor device from infiltrating. Further, it must be constructed such that capacity produced between the pixel electrode, wires and the thin film transistor can be reduced.

Further, it is required to have a low production cost and an excellent productivity. However, it is the present situation that those requirements cannot be met with a silicon oxide film or a silicon nitride film which are normally utilized as an inter-layer insulating film.

SUMMARY OF THE INVENTION

Accordingly, it is an object of the present invention disclosed in this specification to provide a novel structure required to the aforementioned inter-layer insulating film. That is, it is an object of the present invention to provide a structure of a semiconductor device having an inter-layer insulating film which can prevent moisture and impurities from infiltrating, which can suppress the capacity produced between the thin film transistor, pixel electrode and wires whose cost is low and which has a high productivity.

According to one of the present invention disclosed in the present specification, a semiconductor device comprises an inter-layer insulating film made from a resin material disposed at the upper part of a semiconductor element; and a silicon oxide film or a silicon nitride film formed on the whole surface of an underlying layer on which the inter-layer insulating film is formed.

According to another structure of the present invention, a semiconductor device comprises an inter-layer insulating film made from a resin material disposed at the upper part of a semiconductor element; and a laminated film of a silicon oxide film and a silicon nitride film formed on the whole surface of an underlying layer on which the inter-layer insulating film is formed.

In the above-mentioned structure, either the silicon oxide film or the silicon nitride film may be put first in the order of lamination. However, it is preferable to form the silicon nitride film as the lower layer from it, adhesiveness and good interfacial characteristics when the semiconductor element is to be covered.

According to a still other structure of the present invention, a semiconductor device comprises an inter-layer insulating film made from a resin material disposed at the upper part of a semiconductor element; and a silicon oxynitride film formed on the whole surface of an underlying layer on which the inter-layer insulating film is formed.

According to another structure of the present invention, a semiconductor device comprises an inter-layer insulating film made from a resin material disposed at the upper part of a semiconductor element; and a silicon oxide film or a silicon nitride film formed between the semiconductor element and the inter-layer insulating film According to a still other structure of the present invention, a semiconductor device comprises an inter-layer insulating film made from a resin material disposed at the upper part of a semiconductor element; and a silicon oxynitride film formed between the semiconductor element and the inter-layer insulating film.

According to a still other structure of the present invention, a semiconductor device comprises an inter-layer insulating film made from a resin material disposed at the upper part of a semiconductor element; and a laminated film of a silicon oxide film and a silicon nitride film formed between the semiconductor element and the inter-layer insulating film.

Capacity produced between a pixel electrode, wires and a thin film transistor may be reduced by using the laminated film of the silicon nitride film and the resin film as the inter-layer insulating film covering the upper part of the thin film transistor.

Further, because it is possible to flatten the surface of the resin material, no section for riding across a difference in level of wires is formed, thus allowing to prevent local change of resistance of the wires and breaking of the wires.

Further, it is possible to suppress moisture within the resin film from exerting an ill effect to the operation of the thin film transistor by providing the silicon nitride film between the resin film and the thin film transistor so that the resin film does not contact directly with the thin film transistor.

The above and other related objects and features of the invention will be apparent from a reading of the following description of the disclosure found in the accompanying drawings and the novelty thereof pointed out in the appended claims.

DESCRIPTION OF PREFERRED EMBODIMENTS

[First Embodiment]

FIGS. 1 and 2 show steps of fabricating a pixel portion of an active matrix type liquid crystal display according to the present embodiment.

Figure 1A:
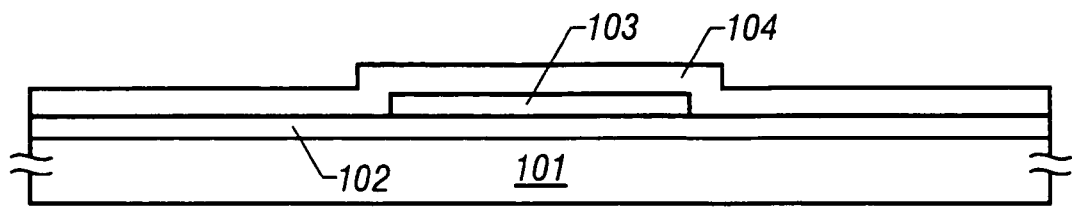
FIGS. 1A through 1D are diagrams showing steps of fabricating a pixel portion of an active matrix circuit.

At first, a silicon oxide film 102 is formed in a thickness of 3000 Å on a glass substrate 101 as an underlying layer by means of plasma CVD as shown in FIG. 1A. This underlying layer has a function of suppressing impurities from diffusing from the glass substrate to a semiconductor layer formed later. It also has a function of relaxing stress which acts between the glass substrate and the semiconductor layer formed later.

It is also useful to use a silicon oxynitride film for the underlying layer. Because the silicon oxynitride film is dense and has a high adhesiveness with the glass substrate, it is highly functional as the underlying layer.

The silicon oxynitride film may be formed by using mixed gas of silane, oxygen and $N_2O$ by means of plasma CVD. It may be obtained by using mixed gas of TEOS gas and $N_2O$ by means of plasma CVD.

Next, an amorphous silicon film not shown is formed. It becomes, later, a starting film of a thin film semiconductor which composes an active layer of the thin film transistor. Here, the amorphous silicon film not shown is formed in a thickness of 500 Å by using low pressure thermal CVD. It is noted that the plasma CVD may be used as a method for forming the amorphous silicon film.

Then, this amorphous silicon film is crystallized by means of a heating process, irradiation of laser light or combination of the heating process and the irradiation of laser light. Thus, a crystalline silicon film not shown is obtained.

Then, this crystalline silicon film not shown is patterned to obtain an active layer 103 of the thin film transistor (FIG. 1A).

Next, a silicon oxide film 104 which covers the active layer 103 as shown in FIG. 1A and functions as a gate insulating film is formed in a thickness of 1000 Å by means of plasma CVD. Thus, a state shown in FIG. 1A is obtained.

It is preferable to use a silicon oxynitride film as an insulating film which functions as the gate insulating film.

Next, an aluminum film, not shown, containing 0.1 weight % of scandium is formed in a thickness of 4000 Å by means of sputtering. This aluminum film composes a gate electrode later.

After forming the aluminum film, a dense anodic oxide film not shown is formed on the surface thereof in a thickness of 100 Å. This anodization is carried out by using electrolyte in which ethylene glycol solution containing 3% of tartaric acid is neutralized by aqueous ammonia and by setting the aluminum film as an anode in the electrolyte.

In this anodization, the thickness of the anodic oxide film to be formed may be controlled by voltage attained.

Further, a resist mask not shown is placed to carry out patterning to form a gate electrode 105.

After forming the gate electrode 105, anodization is carried out again while leaving the resist mask not shown. This anodization is carried out by using 3% aqueous oxalate as electrolyte.

In this anodization, only the side of the gate electrode 105 is anodized selectively because the resist mask not shown remains. An anodic oxide film having a porous structure may be obtained in this step.

Thus, the anodic oxide film 106 having a porous nature is formed on the side of the gate electrode 105.

This porous anodic oxide film may be grown up to about several microns in thickness. This growth distance may be controlled by anodizing time. Here, the anodic oxide film 106 is formed in a thickness of 3000 Å.

Next, anodization is carried out again by using the electrolyte in which ethylene glycol solution containing 3% of tartaric acid is neutralized by aqueous ammonia. Because the electrolyte infiltrates into the inside of the porous anodic oxide film 106 in this anodization step, a dense anodic oxide film 107 is formed around the gate electrode 105.

A thickness of the dense anodic oxide film 107 is 500 Å. A main role of the dense anodic oxide film 107 is to cover the surface of the gate electrode 105 so that no hillock nor whisker is grown in the later steps. It also has a role of protecting the gate electrode 105 so that the gate electrode 105 is not etched in removing the porous anodic oxide film 106 later. It also has a role of contributing in forming an offset gate region in a later step of injecting impurity ions. Thus, the state shown in FIG. 1B is obtained.

Impurity ions are injected in this state. Here, P (phosphorus) ions are injected in order to obtain an N-channel type thin film transistor.

Figure 1B:
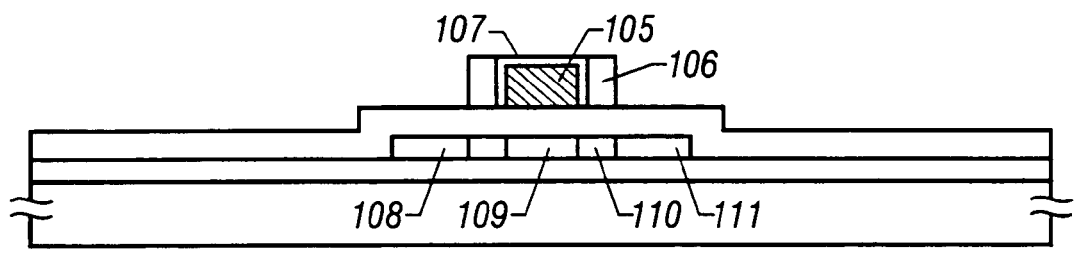

When the impurity ions are injected in the state in FIG. 1B, the impurity ions are injected selectively into regions 108 and 111. In this step, the regions 108 and 111 become high concentration impurity regions.

No impurity ions are injected to a region 109 right under the gate electrode 105 because the gate electrode 105 becomes a mask thereof. This region 109 becomes a channel forming region.

Further, no impurity ions are injected also into a region 110 because the porous anodic oxide film 106 and the dense anodic oxide film 107 become masks thereof. This region 110 is an offset gate region which does not function as a source/drain region nor as a channel forming region. The size of this offset gate region may be decided according to the thickness of the dense anodic oxide film 107 and that of the porous anodic oxide film 106.

The offset gate region relaxes strength of an electric field formed between the channel forming region and the drain region in particular. The presence of the offset gate region allows an OFF current value of the thin film transistor to be reduced and deterioration to be suppressed.

Thus, the source region 108, the channel forming region 109, the offset gate region 110 and the drain region 111 are formed in a self-aligned manner.

It is noted that there is a method of removing the porous anodic oxide film after injecting the impurity ions and of injecting impurity ions again under a light doping condition. In this case, a lightly doped region may be formed right below the porous anodic oxide film 106. The drain side of this lightly doped region is normally called as an LDD (lightly doped drain) region.

After injecting the impurity ions, the porous anodic oxide film 106 is removed selectively. Here, the porous anodic oxide film 106 is removed selectively by using mixed acid of phosphoric acid, acetic acid and nitric acid.

Then, an annealing process is carried out by irradiating laser light. Because the laser light may be irradiated to the neighborhood of the interface between the high concentration impurity region and the offset gate region at this time, junction part which has been damaged by the injection of the impurity ions may be fully annealed.

It is noted that the above-mentioned annealing may be carried out by irradiating ultraviolet ray or infrared ray, instead of the laser light. It is useful to heat in conjunction with the irradiation of the laser light of intense light.

After obtaining the state shown in FIG. 1B, a silicon oxide film 112 is formed in a thickness of 2000 Å as a first inter-layer insulating film. For the first inter-layer insulating film, a silicon nitride film or a laminated film of a silicon oxide film and a silicon nitride film may be used.

Figure 1C:
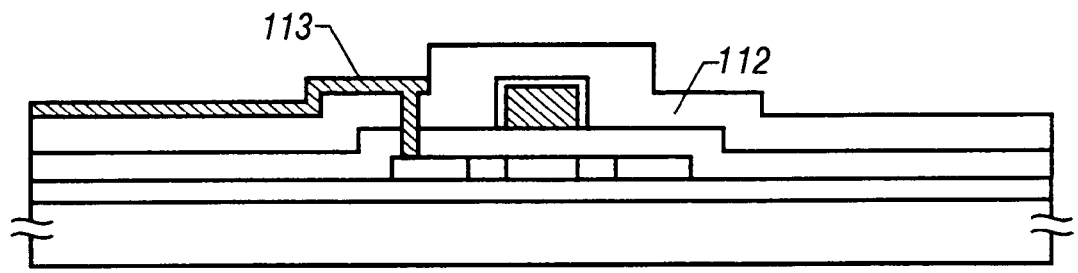

Next, a contact hole is created through the first inter-layer insulating film 112 to create a source electrode 113 which contacts with the source region of the thin film transistor. This source electrode 113 is formed as having a laminated structure of a titanium film, an aluminum film and a titanium film. This source electrode is also formed as what is extended from a source wire. That is, it is formed in the same time when source lines disposed in a matrix in an active matrix region are formed. Thus, the state shown in FIG. 1C is obtained.

Next, a silicon nitride film 114 having a thickness of 1000 Å is formed. This silicon nitride film has a function of suppressing fixed charge from existing in the interface with the thin film transistor by utilizing its dense film quality (generally the film quality of silicon nitride file is dense). It also has a function of preventing moisture and moving ions from infiltrating from the outside by utilizing its dense film quality.

The silicon nitride film 114 is formed by using silane and ammonium by means of plasma CVD. A silicon oxynitride film may be used beside the silicon nitride film.

Next, a silicon oxide film 115 is formed in a thickness of 2000 Å by means of plasma CVD. Although the silicon oxide film 115 is formed here in order to enhance its reliability, it may not be used specifically.

Figure 1D:
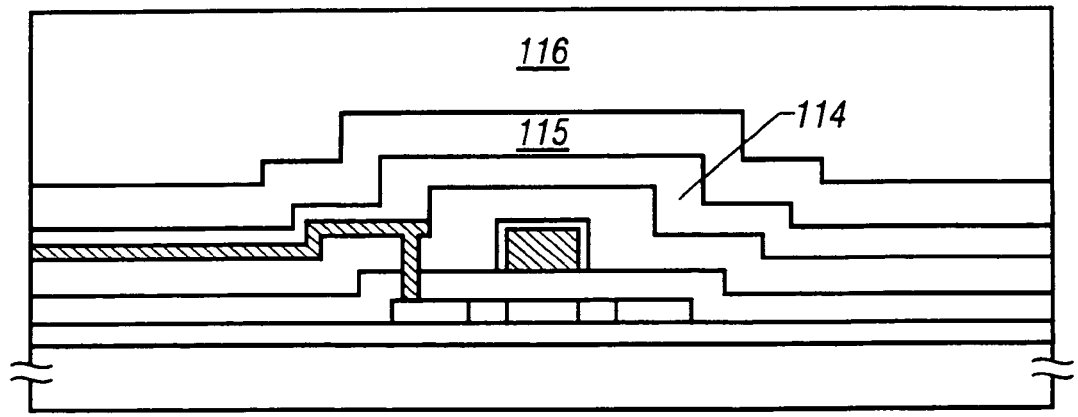

Further, an inter-layer insulating film 116 is formed by using transparent polyimide resin or acrylic resin. The surface of the inter-layer insulating film 116 made from the resin material is made to be flat. The thickness of the inter-layer insulating film 116 made from the resin material is 2 μm. Thus, the state shown in FIG. 1D is obtained.

Capacity produced between the element and the electrodes and wires formed on the inter-layer insulating film may be reduced by creating the inter-layer insulating film by using the resin material. Further, it allows the production cost to be lowered considerably.

Because the silicon oxide film 115 is formed as the underlying layer below the inter-layer insulating film made from the resin material, adhesiveness with the underlying layers may be increased. Further, it allows a structure which suppresses moisture from infiltrating between the silicon oxide film 115 and the underlying layer to be created.

This effect may be obtained even when the inter-layer insulating film made from the resin material is formed on the silicon nitride film 114, without forming the silicon oxide film 115.

Figure 2A:
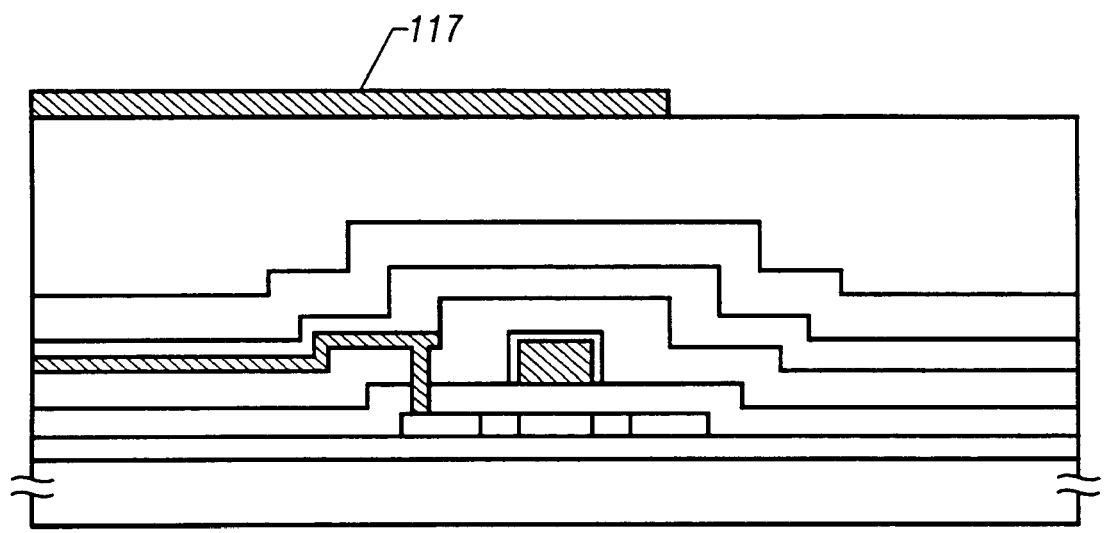
FIGS. 2A and 2B are diagrams showing steps of fabricating the pixel portion of the active matrix circuit.

Next, a chrome film which functions as a light shielding film and as a black matrix is formed and is patterned to form a black matrix 117 functioning as the light shielding film as shown in FIG. 2A.

Here, a resin material whose dielectric constant is less than 3 may be selected for the resin material composing the inter-layer insulating film 116. Its thickness may be increased to several μm. It is noted that because a time of fabrication step will not be prolonged even if the thickness of the resin material is thickened, it is useful to such an end.

By constructing as described above, it is possible to suppress capacity from being produced between the light shielding film 117 made from chrome and the underlying thin film transistor.

Further, because it is easy to flatten the surface of the inter-layer insulating film 116 when it is made form the resin material, the problem of leakage of light caused by its irregularity may be suppressed.

After obtaining the state shown in FIG. 2A, a silicon nitride film is formed further as an inter-layer insulating film 118. Then, a silicon oxide film 119 is formed further.

Although a two-layered structure of the silicon nitride film and the silicon oxide film has been adopted here in order to increase the reliability, a single layer structure of either of them may be adopted.

Further, an inter-layer insulating film 120 made from a resin material is formed. The material may be the same with that of the inter-layer insulating film 116.

By forming the inter-layer insulating film 120 by the resin material, unnecessary capacity may be suppressed from being produced between a pixel electrode created later and the thin film transistor. Further, because its surface may be flattened, it becomes possible to suppress an electric field from the pixel electrode created later from being disturbed.

Then, a contact hole is created, an ITO electrode for forming the pixel electrode is formed by means of sputtering and it is patterned to create the pixel electrode 121.

Figure 2B:
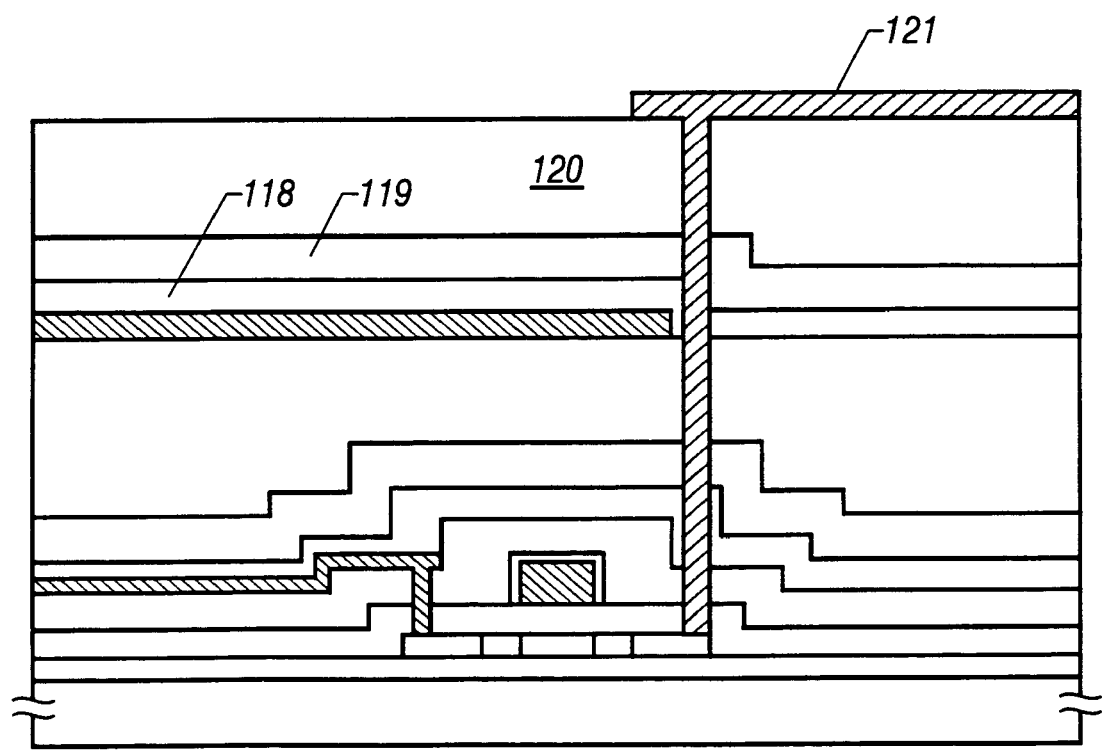

Thus, the structure shown in FIG. 2B is completed. The structure shown in FIG. 2B prevents unnecessary capacity from being produced because dielectric constant of the inter-layer insulating film disposed between the thin film transistor (specifically the source electrode 113) and the light shielding film (and/or black matrix) 117 may be lowered and its thickness can be thickened.

Because it is easy, industrially, to thicken the resin film and it will not increase a processing time as described above, the above-mentioned structure may be readily realized.

[Second Embodiment]

The present embodiment is characterized in that the structure illustrated in the first embodiment is improved further to increase the reliability.

As described above, a metallic material such as chrome is used for the light shielding film and black matrix. However, when a long-term reliability is concerned, there may be problems of diffusion of impurities from the metallic material and of short-circuit caused between the metallic material and other electrodes and wires.

Then, in a structure illustrated in the present embodiment, an anodizable material is used for the light shielding film for shielding the thin film transistor and an anodic oxide film is formed on the surface thereof in addition to the structure illustrated in the first embodiment.

Aluminum or tantalum may be used as the anodizable material. When aluminum is used in particular, a suitable light shielding film may be formed because the anodic oxide film may be colored in black or in color close to that by using the anodizing technology utilized in industrial products such as aluminum sash.

Figure 3A:
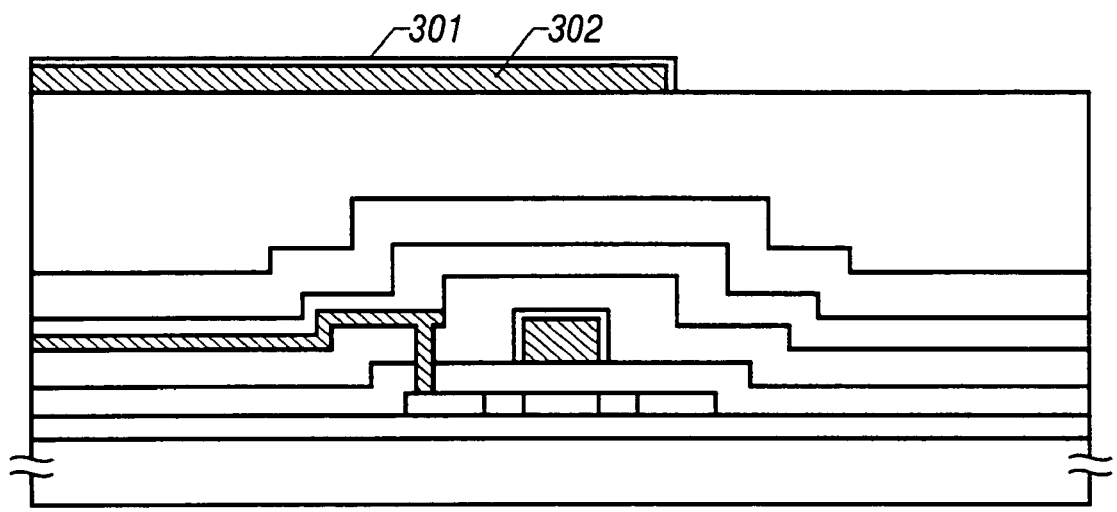
FIGS. 3A and 3B are diagram showing steps or fabricating the pixel portion of the active matrix circuit.
Figure 3B:
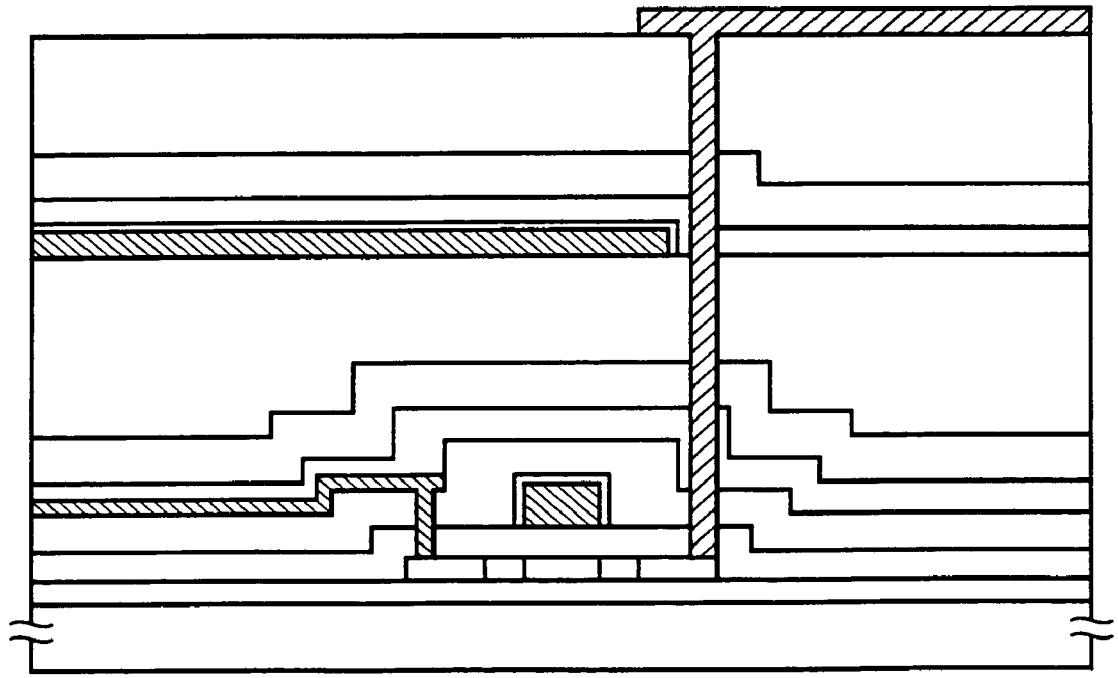

FIGS. 3A and 3B show schematic fabrication steps of the present embodiment. It is noted that the same parts with those in FIG. 2 are not shown specifically in FIGS. 3A and 3B.

At first, the state shown in FIG. 1D is obtained by following the steps shown in FIGS. 1A through 1D. Next, a light shielding film 301 is formed as shown in FIG. 3A. Here, the light shielding film 301 is formed by using aluminum as its material.

Then, an anodic oxide film 302 is formed on the surface of the light shielding film 301 as shown in FIG. 3A by carrying out anodization in electrolyte.

Although the light shielding film 301 is drawn as the light shielding film for shielding the thin film transistor in the figure, it is normally extended to form a black matrix.

After obtaining the state shown in FIG. 3A, an inter-layer insulating film composed of a silicon nitride film and a silicon oxide film and an inter-layer insulating film composed of a resin material are formed in a multi-layer.

Further, a pixel electrode is forked by ITO, thus obtaining the state shown in FIG. 3B.

Because the anodic oxide film 302 is chemically stable, the structure shown in the present embodiment allows to suppress impurities from diffusing from the light shielding film 301 to the surroundings when the long-term reliability is concerned. Further, the light shielding film can be prevented from being short-circuited.

[Third Embodiment]

The present embodiment relates to a structure in which aperture ratio of a pixel is increased further. Generally, it is desired to increase the aperture ratio of the pixel as much as possible. It is necessary to dispose the pixel electrode in a widest possible area in order to increase the aperture ratio of the pixel.

However, because capacity is produced between the pixel electrode and the thin film transistor and the wires when they are overlapped each other, it has been limited greatly in this aspect in general.

The present embodiment provides a structure for reducing the problem of producing the capacity.

Figure 4:
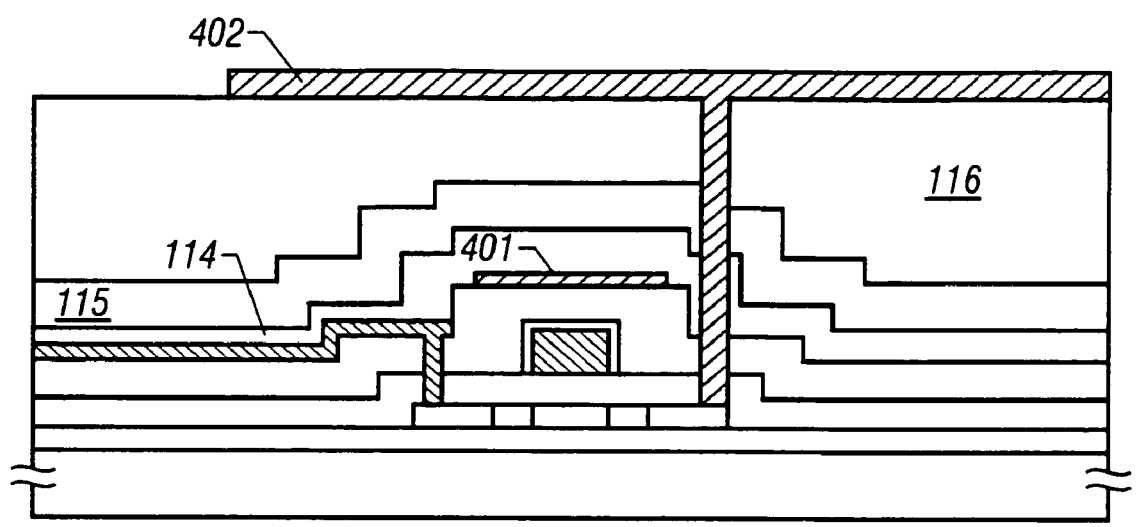
FIG. 4 is a diagram showing a step of fabricating the pixel portion of the active matrix circuit.

FIG. 4 shows the structure of the present embodiment. In the structure shown in FIG. 4, source lines and gate lines disposed in a matrix are caused to function as a black matrix and an area of the pixel electrode 402 is increased as much as possible.

In the structure shown in FIG. 4, a light shielding film 401 for covering the main part of the thin film transistor is formed by a metallic material forming the source electrode (and the source line).

Part of the source line and gate line may be used as the black matrix by disposing the pixel electrode so that the part of the source line and gate line overlap the pixel electrode.

Because the pixel electrode may be disposed across the wide area when the structure shove in FIG. 4 is adopted, the aperture ratio of the pixel may be increased.

Further, even if such structure is adopted, the capacity produced between the pixel electrode 402 and the thin, film transistor may be reduced because the inter-layer insulating film 116 made from the resin material exists.

Still more, it can be alleviated that unnecessary pressure would be applied to the thin film transistor in a rubbing step and panel assembling step after forming the pixel electrode 402, by using the resin material as the inter-layer insulating film.

The silicon oxide film 115 is formed across the whole surface below the resin material 116 forming the inter-layer insulating film and the silicon nitride film 114 is former below that. Because the thin film transistor is covered by the silicon nitride film 114, the electrical stability of the thin film transistor may be assured.

The electrical stability of the thin film transistor may be enhanced because the silicon nitride film 114 can prevent moisture from diffusing from the inter-layer insulating film 116 made from the resin material to the thin film transistor section.

[Fourth Embodiment]

A case when an N-channel type thin film transistor and a P-channel type thin film transistor are formed complementarily is shown in the present embodiment. The structure of the present embodiment may be used for various thin film integrated circuits integrated on an insulating surface for example. It may be used also for a peripheral driving circuits of an active matrix type liquid crystal display for example.

Figure 5A:
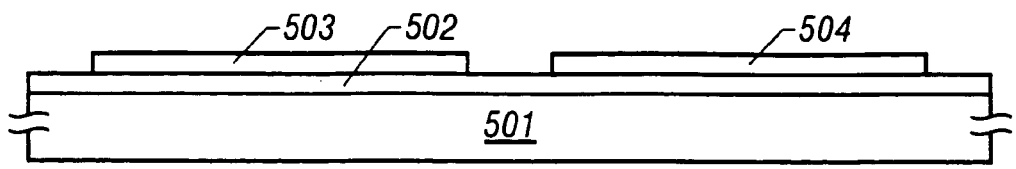
FIGS. 5A through 5F are diagrams showing steps of fabricating a thin film transistor constructed as a complementary type transistor.

At first, a silicon oxide film or a silicon oxynitride film is formed as an underlying film 502 on a glass substrate 501 as shown in FIG. 5A. Further, an amorphous silicon film not shown is formed further by means of plasma CVD or low pressure thermal CVD. This amorphous silicon film is transformed into crystalline silicon film by irradiating laser light or by applying heat to the amorphous silicon film.

The crystalline silicon film thus obtained is patterned to obtain active layers 503 and 504. Thus, the state shown in FIG. 5A is obtained.

Further, a silicon oxide film 505 which composes a gate insulating film is formed. Then, an aluminum film not shown is formed in a thickness of 4000 Å to form a gate electrode later. An anodizable metal (tantalum for example) may by used beside the aluminum film.

After forming the aluminum film, a very thin and dense anodic oxide film is formed on the surface thereof by the method described above.

Next, a resist mask not shown is disposed on the aluminum film to pattern the aluminum film. Then, anodization is carried out by using the aluminum pattern obtained as an anode to form porous anodic oxide films 508 and 509. A thickness of the porous anodic oxide film is 5000 Å for example.

Figure 5B:
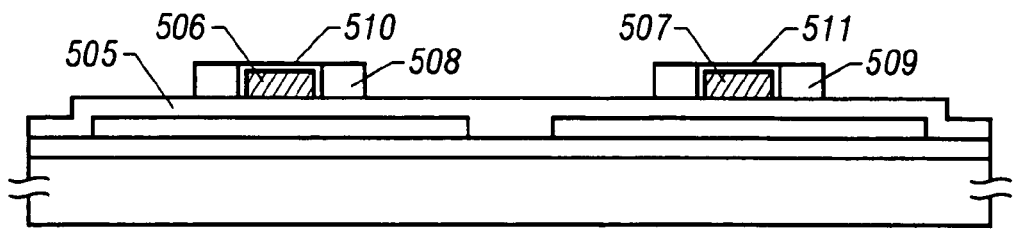

Anodization is carried out again under the condition of forming a dense anodic oxide film to form dense anodic oxide films 510 and 511. A thickness of these dense anodic oxide films 510 and 511 is 800 Å. Thus, the state shown in FIG. 5B is obtained.

Figure 5C:
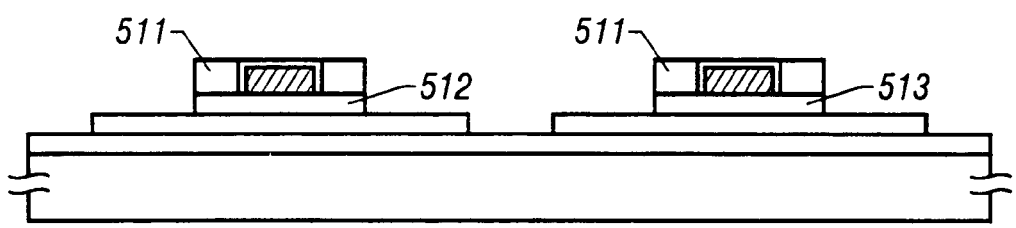

Then, the exposed silicon oxide film is removed by means of dry etching, thus obtaining the state shown in FIG. 5C.

Figure 5D:
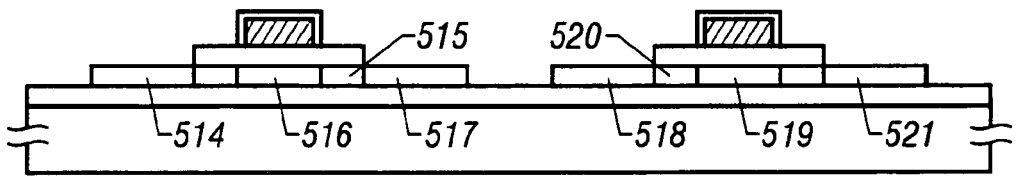

After obtaining the state shown FIG. 5C, the porous anodic oxide films 508 and 509 are removed by using mixed acid of acetic acid, nitric acid and phosphoric acid. Thus, the state shown in FIG. 5D is obtained.

Here, resist masks are disposed alternately so that P ions are injected to the left thin film transistor and S ions, are injected to the right thin film transistor.

By injecting the impurity ions, a high concentration N type source region 514 and drain region 517 are formed in a self-aligned manner.

Further, a weak N type region in which the P ions are doped in low concentration is formed in the same time. Further, a channel forming region 516 is formed in the same time.

The weak N type region 515 is formed because the remaining gate insulating film 512 exists. That is, the P ions which has transmitted through the gate insulating film 512 is partly blocked by the gate insulating film 512.

A strong P type source region 521 and drain region 518 are formed in a self-aligned manner by the same principle. A low concentration impurity region 520 as well as a channel forming region 519 are formed in the same time.

When the dense anodic oxide films 510 and 511 are as thick as 2000 Å, an offset gate region can be formed by virtue of the thickness in contact with the channel forming region.

The existence thereof may be neglected in the case of the present embodiment because the thickness of the dense anodic oxide films 510 and 511 is so thin as less than 1000 Å.

Then, the regions to which the impurity ions have been injected are annealed by irradiating laser light or intense light.

Figure 5E:
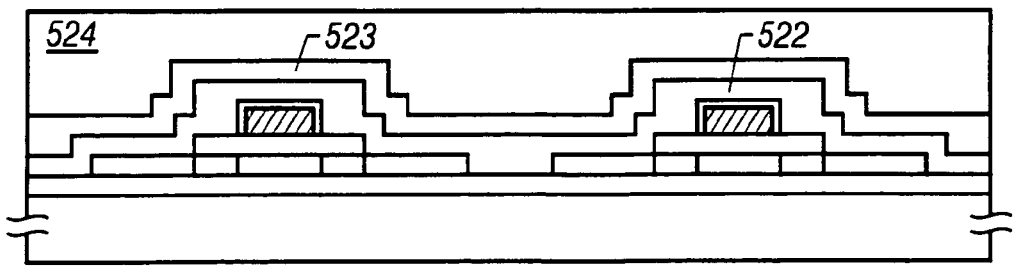
Figure 5F:
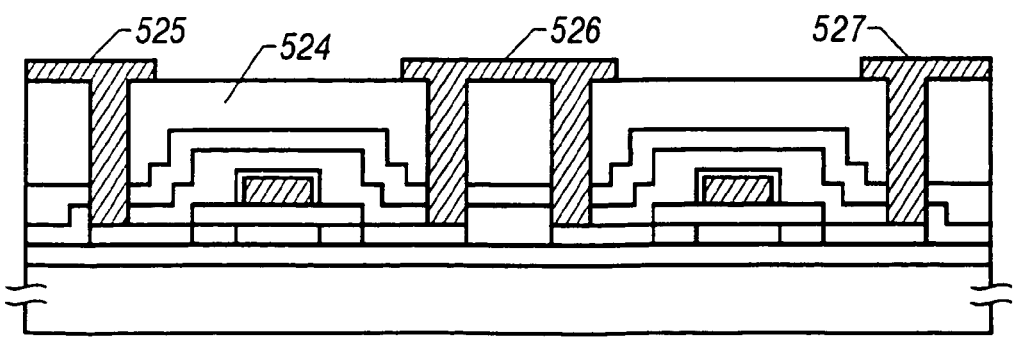

Then, a silicon nitride film 522 and a silicon oxide film 523 are formed as inter-layer insulating films as shown in FIG. 5E. Their thickness is 1000 Å. It is noted that the silicon oxide film 523 may not be formed.

Here, the thin film transistor is covered by the silicon nitride film. The reliability of the thin film transistor may be increased by adopting this structure because the silicon nitride film is dense and has a good interfacial characteristic.

Further, an inter-layer insulating film 524 made from a resin material is formed by using spin coating. Here, a thickness of the inter-layer insulating film 524 is 1 µm (FIG. 5E).

Then, contact holes are created and a source electrode 525 and a drain electrode 526 of the left N channel type thin film transistor are formed. In the same time, a source electrode 527 and the drain electrode 526 of the right thin film transistor are formed. Here, the drain electrode 525 is disposed in common.

Thus, a thin film transistor circuit having the complementarily constructed CMOS structure may be formed.

In the structure shown in the present embodiment, the thin film transistor is covered by the nitride film and the resin material. This structure allows to form the device to which moving ions and moisture hardly infiltrate and which is highly durable.

Further, it allows to prevent capacity from being produced between the thin film transistor and wires when multi-layered wires is formed.

[Fifth Embodiment]

The present embodiment shows steps for fabricating a thin film transistor called a bottom gate type thin film transistor in which a gate electrode is located on the side of a substrate rather than an active layer.

Figure 6A:
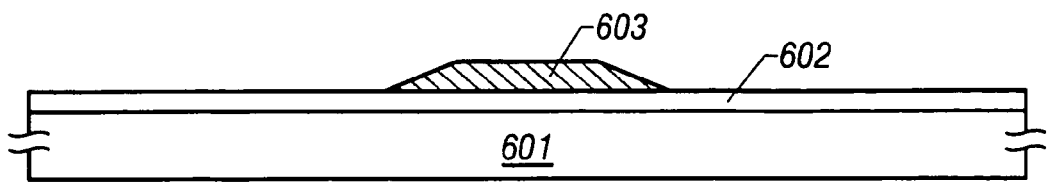
FIGS. 6A through 6E are diagrams showing steps of fabricating a thin film transistor.

FIGS. 6A through 6E show the fabrication steps of the present embodiment. At first, a silicon oxide film 602 is formed as an underlying film on a glass substrate 601 by means of sputtering as shown in FIG. 6A. Next, a gate electrode 603 is formed by aluminum.

At this time, 0.18 weight % of scandium is contained in the aluminum. Further, other impurities are reduced as much as possible to lower their concentration. These are carried out in order to suppress projections called hillock of whisker from being formed by abnormal growth of the aluminum in the later steps.

Thus, the state shown in FIG. 6A is obtained. Next, a silicon oxide film 604 which functions as a gate insulating film is formed in a thickness of 500 Å by means of plasma CVD.

Further, an amorphous silicon film (which becomes a crystalline silicon film 605 later) not shown which is a starting film for forming an active layer of the thin film transistor is formed by means of plasma CVD. Low pressure thermal CVD may be used beside the plasma CVD.

Next, the amorphous silicon film not shown is crystallized by irradiating laser light. Thus, the crystalline silicon film 605 is obtained.

Figure 6B:
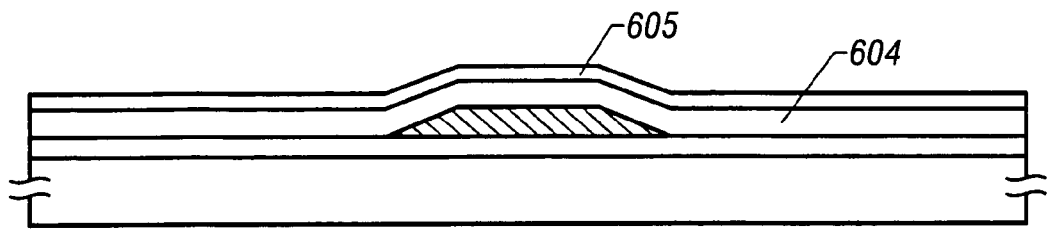

Thus, the state shown in FIG. 6B is obtained. After obtaining the state shown in FIG. 6B, patterning is carried out to obtain an active layer 606.

Next, a silicon nitride film not shown is formed and exposure is carried out from the back of the substrate 601 by using the gate electrode 603 to form a mask pattern 607 made from a silicon nitride film.

This mask pattern 607 is formed as follows. A first, a resist mask pattern is formed by exposing from the back of the substrate 601 by utilizing the pattern of the gate electrode 603. Further, ashing is carried out to cause this resist mask pattern to recede. Then, the pattern 607 is obtained by patterning the silicon nitride film by using the receded resist mask pattern (not shown).

Figure 6C:
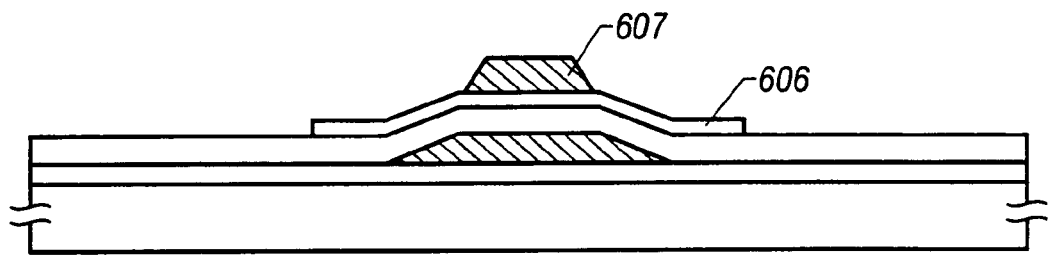

Thus, the state shown in FIG. 6C is obtained. Next, impurities are doped by using the mask pattern 607. Here, P (phosphorus) is used as a dopant and plasma doping is used as means for doping.

P is doped into regions 608 and 610 in this step. P is not doped into a region 609.

After finishing the doping, activation of the doped regions and annealing of damage caused by the impact of the dopant ions are carried out by irradiating laser light from the top.

Thus, the region 608 is formed as a source region. Further, the region 610 is formed as a drain region. The region 609 is then defined as a channel region.

Figure 6D:
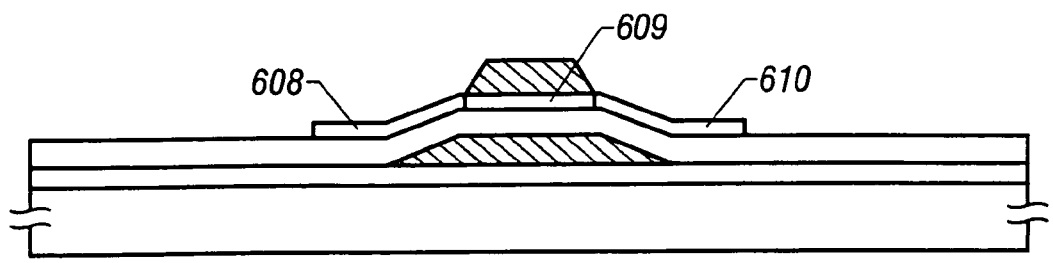
Figure 6E:
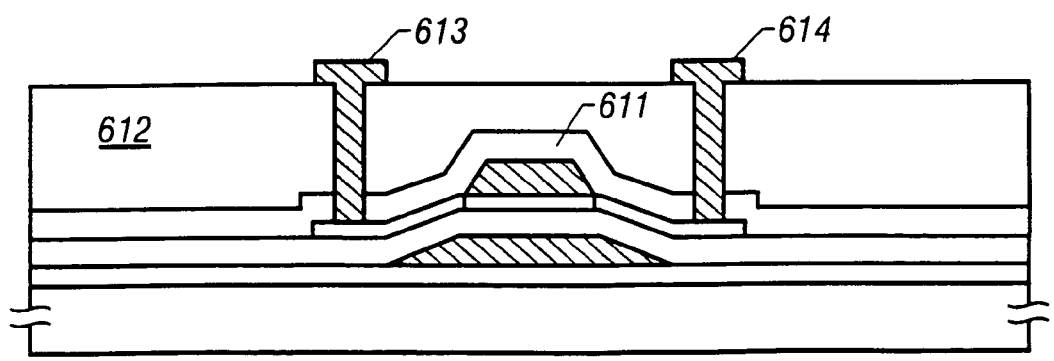

Thus, the state shown in FIG. 6D is obtained. Next, an inter-layer insulating film 611 made from a silicon nitride film is formed in a thickness of 2000 Å by means of plasma CVD.

The silicon nitride film is most preferable as the inter-layer insulating film used here, because the silicon nitride film exhibits its effect most strongly in preventing an effect of moisture existing in a resin inter-layer film formed thereon later (effect to the active layer 606).

Beside the silicon nitride film, a silicon oxide film, a silicon oxynitride film or a laminated film of the silicon oxide film and the silicon nitride film (either of them may be put first in the order of lamination) may be used.

Next, a resin film 612 made from polyimide is formed as an inter-layer insulating film. It is formed by means of spin coating.

Further, contact holes are created to form a source electrode 613 and a drain electrode 614.

There has been a problem when the resin material is used as the inter-layer insulating film that the characteristic of the device is influenced by the moisture (OH radical in particular) existing in the resin material. However, such problem which arises when the resin material is used for the inter-layer insulating film may be suppressed by providing the silicon nitride film which prevents moisture from moving as described in the present embodiment.

The utilization of the invention disclosed in the present specification allows to obtain the structure of the semiconductor device which provides a high reliability, which can suppress the problem of capacity produced between the thin film transistor and the pixel electrode and wires and which provides low cost and highly productive semiconductor devices. The invention disclosed in the present specification may be utilized not only for the active matrix type liquid crystal display but also for EL type displays and IC circuits.

While preferred embodiments have been described, variations thereto will occur to those skilled in the art within the scope of the present inventive concepts which are delineated by the following claims.

The invention claimed is:

1. An EL display device comprising:
   plural pixels formed over a substrate;
   a switching element formed in each of the plural pixels and including at least one thin film transistor formed over the substrate, the thin film transistor comprising:
   a semiconductor island formed over the substrate, the semiconductor island having at least one pair of impurity regions with a channel region interposed therebetween;
   a gate electrode formed adjacent to the channel region with a gate insulating film interposed therebetween,
   a first insulating film formed over the thin film transistor;
   a second insulating film formed over the first insulating film;
   an organic resin film formed on the second insulating film; and
   a pixel electrode formed over the organic resin film and electrically connected to one of the impurity regions,
   wherein the first insulating film comprises a material selected from the group consisting of silicon nitride and silicon oxynitride,
   wherein the second insulating film comprises a material selected from the group consisting of silicon nitride, silicon oxide and silicon oxynitride.

2. The EL display device according to claim 1, wherein the thin film transistor has at least one lightly doped region formed between the channel region and the pair of impurity regions.

3. The EL display device according to claim 1, wherein the organic resin film comprises a material selected from the group consisting of polyimide and acrylic resins.

4. An EL display device comprising:
   a substrate;
   an underlying film comprising silicon oxynitride formed over the substrate;
   plural pixels formed over the underlying film;
   a switching element formed in each of the plural pixels and including at least one thin film transistor formed over the underlying film, the thin film transistor comprising:
   a semiconductor island formed over the substrate, the semiconductor island having at least one pair of impurity regions with a channel region interposed therebetween;
   a gate electrode formed adjacent to the channel region with a gate insulating film interposed therebetween,
   a first insulating film formed over the thin film transistor;
   a second insulating film formed over the first insulating film;
   an organic resin film formed on the second insulating film; and
   a pixel electrode formed over the organic resin film and electrically connected to one of the impurity regions,
   wherein the first insulating film comprises a material selected from the group consisting of silicon nitride and silicon oxynitride,
   wherein the second insulating film comprises a material selected from the group consisting of silicon nitride, silicon oxide and silicon oxynitride.

5. The EL display device according to claim 4, wherein the thin film transistor has at least one lightly doped region formed between the channel region and the pair of impurity regions.

6. The EL display device according to claim 4, wherein the organic resin film comprises a material selected from the group consisting of polyimide and acrylic resins.

7. An EL display device comprising:
   a pixel circuit and a driver circuit over a substrate;
   at least first and second semiconductor islands formed, in the driver circuit, the first semiconductor island having at least one pair of n-type impurity regions therein and the second semiconductor island having at least one pair of p-type impurity regions therein;
   first and second gate electrodes formed adjacent to the first and second semiconductor islands, respectively with a gate insulating film interposed therebetween;
   a first insulating film formed over the first and second gate electrodes;
   a second insulating film formed over the first insulating film;
   an organic resin film formed on the second insulating film; and
   first and second electrodes formed over the organic resin film and electrically connected to the first and second semiconductor islands, respectively,
   wherein the first insulating film comprises a material selected from the group consisting of silicon nitride and silicon oxynitride,
   wherein the second insulating film comprises a material selected from the group consisting of silicon nitride, silicon oxide and silicon oxynitride.

8. The EL display device according to claim 7, wherein the organic resin film comprises a material selected from the group consisting of polyimide and acrylic resins.

9. An EL display device comprising:
   plural pixels formed over a substrate;
   a switching element formed in each of the plural pixels and including at least one thin film transistor formed over the substrate, the thin film transistor comprising:
   a semiconductor island formed over the substrate, the semiconductor island having at least one pair of impurity regions with a channel region interposed therebetween;
   a gate electrode formed adjacent to the channel region with a gate insulating film interposed therebetween,
   a first insulating film formed over the thin film transistor;
   a second insulating film formed over the first insulating film;
   a third insulating film formed on the second insulating film; and
   a pixel electrode formed over the third insulating film and electrically connected to one of the impurity regions,
   wherein the first insulating film comprises a material selected from the group consisting of silicon nitride and silicon oxynitride,
   wherein the second insulating film comprises a material selected from the group consisting of silicon nitride, silicon oxide and silicon oxynitride,
   wherein the third insulating film has a flattened surface.

10. The EL display device according to claim 9, wherein the thin film transistor has at least one lightly doped region formed between the channel region and the pair of impurity regions.

11. An EL display device comprising:
    a substrate;

an underlying film comprising silicon oxynitride formed over the substrate;

plural pixels formed over the underlying film;

a switching element formed in each of the plural pixels and including at least one thin film transistor formed over the underlying film, the thin film transistor comprising:

a semiconductor island formed over the substrate, the semiconductor island having at least one pair of impurity regions with a channel region interposed therebetween;

a gate electrode formed adjacent to the channel region with a gate insulating film interposed therebetween, a first insulating film formed over the thin film transistor;

a second insulating film formed over the first insulating film;

a third insulating film formed on the second insulating film; and a pixel electrode formed over the third insulating film and electrically connected to one of the impurity regions, wherein the first insulating film comprises a material selected from the group consisting of silicon nitride and silicon oxynitride, wherein the second insulating film comprises a material selected from the group consisting of silicon nitride, silicon oxide and silicon oxynitride, wherein the third insulating film has a flattened surface.

12. The EL display device according to claim 11, wherein the thin film transistor has at least one lightly doped region formed between the channel region and the pair of impurity regions.

13. A EL display device comprising:

a pixel circuit and a driver circuit over a substrate;

at least first and second semiconductor islands formed, in the driver circuit, the first semiconductor island having at least one pair of n-type impurity regions therein and the second semiconductor island having at least one pair of p-type impurity regions therein;

first and second gate electrodes formed adjacent to the first and second semiconductor islands, respectively with a gate insulating film interposed therebetween;

a first insulating film formed over the first and second gate electrodes;

a second insulating film formed over the first insulating film;

a third insulating film formed on the second insulating film; and first and second electrodes formed over the third insulating film and electrically connected to the first and second semiconductor islands, respectively, wherein the first insulating film comprises a material selected from the group consisting of silicon nitride and silicon oxynitride, wherein the second insulating film comprises a material selected from the group consisting of silicon nitride, silicon oxide and silicon oxynitride, wherein the third insulating film has a flattened surface.

* * * * *

UNITED STATES PATENT AND TRADEMARK OFFICE
CERTIFICATE OF CORRECTION

PATENT NO. : 7,034,381 B2  Page 1 of 1
APPLICATION NO. : 10/927092
DATED : April 25, 2006
INVENTOR(S) : Shunpei Yamazaki It is certified that error appears in the above-identified patent and that said Letters Patent is hereby corrected as shown below:

Cover page, item (73), line 1, change "Energey" to --Energy--.

Signed and Sealed this

Twenty-fifth Day of July, 2006

JON W. DUDAS
*Director of the United States Patent and Trademark Office*